United States Patent
Matsubara

[11] Patent Number: 6,048,760
[45] Date of Patent: Apr. 11, 2000

[54] METHOD OF FORMING A SELF-ALIGNED REFRACTORY METAL SILICIDE CONTACT USING DOPED FIELD OXIDE REGIONS

[75] Inventor: Yoshihisa Matsubara, Tokyo, Japan

[73] Assignee: NEC Corporation, Tokyo, Japan

[21] Appl. No.: 08/900,258

[22] Filed: Jul. 25, 1997

[30] Foreign Application Priority Data

Jul. 30, 1996 [JP] Japan ................................. 8-200662

[51] Int. Cl.⁷ ............................................. H01L 21/8238
[52] U.S. Cl. ...................... 438/225; 438/231; 438/449; 438/664; 438/683
[58] Field of Search ................................... 438/658, 663, 438/664, 682, 683, 659, 660, 439, 199, 225, 297, 449, 450, 451, 420, 400, 231; 257/384

[56] References Cited

U.S. PATENT DOCUMENTS 5,757,045  5/1998  Tsai et al. ................................. 257/336
5,830,790  11/1998  Kim et al. ................................ 438/227

*Primary Examiner*—Wael Fahmy
*Assistant Examiner*—Kurt Eaton

*Attorney, Agent, or Firm*—Sughrue, Mion, Zinn, Macpeak & Seas, PLLC

[57] ABSTRACT

A method of manufacturing a semiconductor device comprising the steps of masking element areas of a silicon substrate of a first conductivity type with a masking layer; forming a field oxide film on field areas of the silicon substrate which are not protected by said masking layer to define separate element areas; introducing first impurities of the first conductivity type into the field oxide film; removing the masking layer and introducing second impurities of a second conductivity type opposite the first conductivity type into the field oxide film and into the element area to form an impurity diffusion layer; forming a refractory metal film over an area extending from the impurity diffusion layer to the field area; and heat treating to form a refractory metal silicide on the surface of the impurity diffusion layer. The first impurities are present in the field oxide film in an amount sufficient to suppress a reaction between the refractory metal layer and the impurity-containing field oxide film in the heat treating step. The inventive method suppresses the formation of a leakage path during silicide processing over the field oxide area and between the diffusion areas of adjacent transistors.

22 Claims, 14 Drawing Sheets

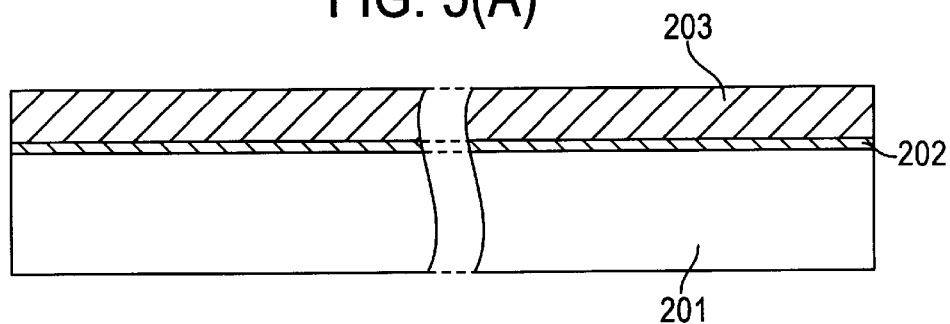
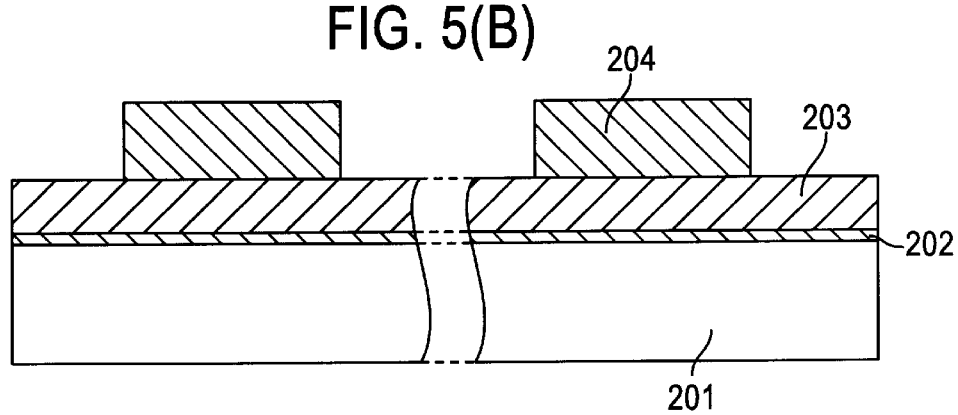
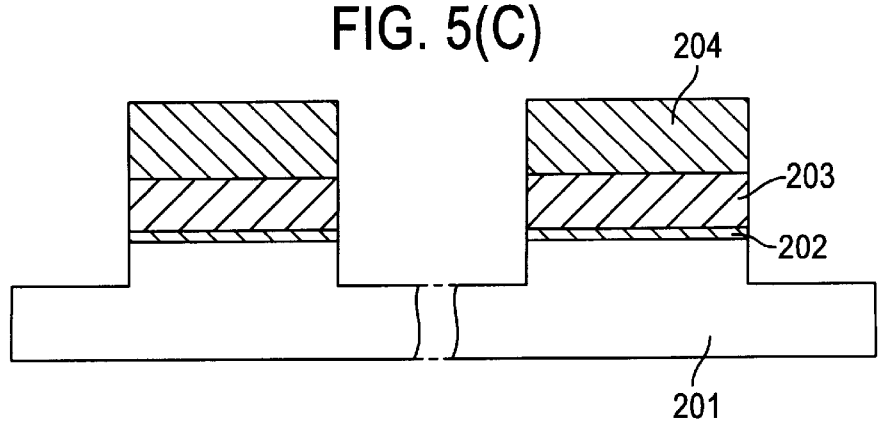

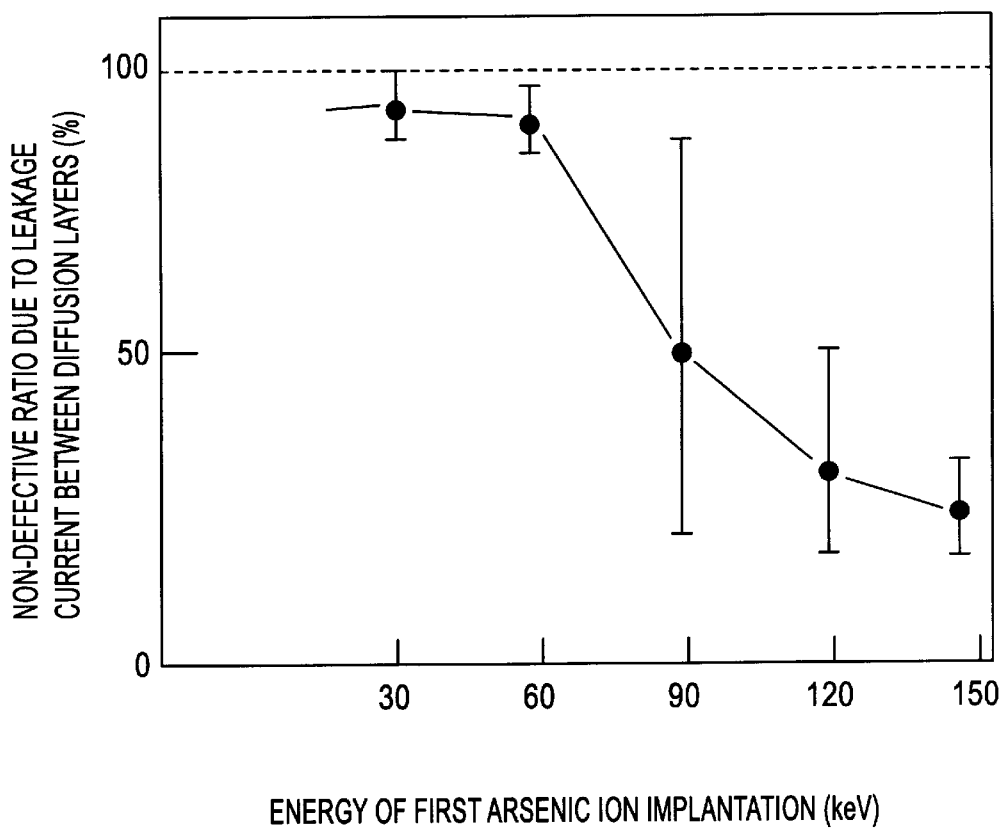

METHOD OF FORMING A SELF-ALIGNED REFRACTORY METAL SILICIDE CONTACT USING DOPED FIELD OXIDE REGIONS

BACKGROUND OF THE INVENTION

1. Field of the Invention

The present invention relates to a semiconductor device manufacturing method and, more particularly, to a method of forming an element isolation area including a method of forming a refractory metal silicide film on a diffusion layer of a CMOS transistor in a self aligning manner.

2. Description of the Related Art

Extensive investigations are still being conducted for reducing the size of semiconductor devices and for providing denser packaging. Currently, very large-scale integrated semiconductor devices such as memory devices and logic devices designed with a feature size as narrow as 0.15 to 0.25 micron are being manufactured.

As the integration of semiconductor devices increases, reducing the dimensions of diffusion layer widths and the film thickness of materials constituting semiconductor devices becomes increasingly important. However, this reduction inevitably results in an increase in the wiring resistance of the diffusion layers and electrode materials, which significantly affects the circuit delay.

Therefore, a resistance lowering technology using a refractory metal silicide is essential for manufacturing microscopic semiconductor devices. Especially, silicide (self-align-silicide) technology using a titanium alloy for the refractory metal is important for manufacturing a microscopic insulation gate field effect transistor (hereinafter referred to as a MOS transistor).

In addition, in MOS transistors having the above-described structure, the diffusion of impurities forming the diffusion layer must be suppressed as semiconductor integration continues to increase, to thereby suppress the transistor short channel effect.

Consequently, if the junction face of the diffusion layer contacts the silicide area layer, crystalline defect leakage current increases to disable the transistor switching operation. Therefore, the silicide layer must be made thinner as the junction of the diffusion layer becomes shallower.

FIGS. 9(A)–9(C) through 12(A)–12(B) show cross sections sequentially illustrating prior-art manufacturing processes for MOS transistors having a silicide structure.

First, as shown in FIG. 9(A), a silicon oxide film 302 is formed on the main surface of a silicon substrate 301, and a silicon nitride film 303 is formed on the silicon oxide film 302.

Next, as shown in FIG. 9(B), a resist 304 is patterned by a general lithography technique to open an element isolation area.

As shown in FIG. 9(C), the silicon nitride film 303, the silicon oxide film 302 and the silicon substrate 301 are selectively etched by a dry etching technique.

As shown in FIG. 10(A), the resist is removed and then the silicon substrate 301 is oxidized by heat treating in an $H_2O_2$ atmosphere to form a field oxide film 305.

As shown in FIG. 10(B), the silicon nitride film 303 and the silicon oxide film 302 are removed by wet etching. Then, a gate oxide film 307 is formed, a polysilicon film is formed, and the polysilicon is patterned to form a polysilicon gate electrode 308 in this order.

Next, after forming a silicon nitride film, the silicon nitride film is anisotropically etched to form a sidewall spacer 309.

Then, as shown in FIG. 10(C), those portions on which a P-channel MOS transistor is to be formed are coated with a resist 306A. Those portions on which an N-channel MOS transistor is to be formed are ion-implanted with arsenic 311 to form $N^+$ diffusion layers 312 on the silicon substrate. This diffusion layer provides the source and drain of the N-channel MOS transistor by subsequently applying an activating heat treatment. It should be noted that the black dots in FIGS. 10(C) through 11(C) denote arsenic introduced into the field silicon oxide film 305 by ion implantation.

As shown in FIG. 11(A), the portion on which the N-channel MOS transistor is formed is coated with a resist 306B, and the portion on which the P-channel MOS transistor is formed is ion-implanted with boron ($BF_2$) 313 to form $P^+$ diffusion layers 314 on the silicon substrate. This diffusion layer provides the source and drain of the P-channel MOS transistor by a subsequently applied activating heat treatment. Namely, after removing the resist, the $P^+$ diffusion layers 314 are formed by heat treating at a temperature of from 800 to 1000 degrees centigrade.

Thus, as shown in FIG. 11(B), if the MOS transistor is an N-channel type, the $N^+$ diffusion layers 312 containing arsenic are formed, and, if the MOS transistor is a P-channel type, the $P^+$ diffusion layers 314 containing boron are formed, to provide the source and drain of the transistors, respectively.

Then, as shown in FIG. 11(C), a titanium film 315 about 50 nm thick is formed over the whole surface of the wafer by metal sputtering or the like.

After the process of FIG. 11(C), the silicon substrate is heat-treated (the first heat treatment) in a nitrogen atmosphere at atmospheric pressure for 30 to 60 seconds.

Generally, a lamp annealing apparatus is used for the heat treatment, and the heat treatment temperature is set to from 600 to 650 degrees centigrade. Thus, a titanium silicide is formed. A C49-structure silicide layer 316 having a crystalline structure and a high electrical specific resistance of about 60 $\mu\Omega\cdot cm$ and a titanium nitride layer 317 are formed on the exposed surface of the gate electrode polysilicon 308 and the surfaces of the $N^+$ diffusion layer 312 and the $P^+$ diffusion layer 314, respectively.

The above-mentioned state is shown only with respect to the P-channel MOS transistor in FIG. 12(A).

Next, the titanium nitride layer 317 is removed by a liquid chemical obtained by mixing an ammoniacal solution, pure water and hydrogen peroxide water. Thus, the C49 structure silicide layer 316 is formed only on the gate electrode polysilicon and the $N^+$ diffusion layers and the $P^+$ diffusion layers forming the source/drain areas.

Furthermore, a second heat treatment is performed in a nitrogen atmosphere at atmospheric pressure for about 60 seconds. The lamp annealing apparatus mentioned above is used for the heat treatment apparatus, and the processing temperature is set to about 850 degrees centigrade. By this processing, the above-mentioned C49 structure silicide layer 316 is changed to a C54 structure silicide layer 318 having a crystalline structure having a low electrical specific resistance of about 20 $\mu\Omega\cdot cm$.

This state is shown only with respect to the P-channel MOS transistor in FIG. 12(B) as in FIG. 12(A).

Then, an interlayer film is formed by growing an oxide film, and lithographic processing and oxide film etching are carried out to expose contacts. A metal such as aluminum is sputtered thereon, and lithographic processing and etching are carried out again, to thereby form an aluminum wiring.

Thus, in the above-mentioned prior-art technology, an undesired C49 silicide structure 316R (FIG. 12(A)) is formed on the silicon oxide film 305 in the field area by the silicide reaction due to the reaction between silicon and titanium and the reduction of the silicon oxide film during heat treatment (the first heat treatment) of the titanium film 315 in a nitrogen atmosphere. This leads to an undesired C54 silicide structure 318R (FIG. 12(B)), resulting in an undesired short circuit path between the P$^+$ diffusion layers 314 of different MOS transistors. This problem is described in further detail as follows.

Generally, the silicide reaction is suppressed to a greater extent as the impurity density increases. Therefore, the temperature of the first heat treatment used in forming the silicide must be increased to activate the reaction.

FIG. 13 shows the sheet resistance as a function of heat treatment temperature. At heat treatment temperatures 700 degrees centigrade or higher, the resistance of the silicide can be decreased. On the other hand, at these temperatures, a reaction with the silicon oxide film occurs.

FIG. 14 shows the decrease in silicon oxide film thickness as a function of the first heat treatment temperature due to reduction of the silicon oxide film by the titanium film.

FIG. 14 represents data including as parameters the wet etching time after forming the silicide by the first heat treatment and the presence or absence of the heat treatment (the second heat treatment) for the phase transition from a C49 structure to a C54 structure. In FIG. 14, the black triangle, square and circle symbols are associated with the P-channel MOS transistor ($P_{ch}$), while the white triangle, square and circle symbols are associated with the N-channel MOS transistor ($N_{ch}$).

As the heat treatment temperature is increased, the film thickness of the silicon oxide film is reduced to a greater extent. Especially, there is a large reduction in the thickness of a silicon oxide film that is implanted with boron. This is because the implanted boron promotes a reaction which reduces the thickness of the silicon oxide film, to thereby decrease the thickness of the oxide film involved in the silicide reaction and form a silicide on the silicon oxide film.

This gives rise to the problem of forming a short circuit path along the silicide film which spans the diffusion layers in the silicide forming process of a P-channel MOS transistor.

SUMMARY OF THE INVENTION

It is therefore an object of the present invention to provide a method of manufacturing a semiconductor device which prevents the above-described problems of the prior art relating to the formation of a leakage path during silicide processing over the field oxide area and between the diffusion areas of adjacent transistors.

In accordance with a first embodiment, the present invention provides a method of manufacturing a semiconductor device comprising the steps of: masking element areas of a silicon substrate of a first conductivity type with a masking layer; forming a field oxide film on field areas of the silicon substrate which are not protected by said masking layer to define separate element areas; introducing first impurities of said first conductivity type into said field oxide film; removing said masking layer and introducing second impurities of a second conductivity type opposite said first conductivity type into said field oxide film and into said element area to form an impurity diffusion layer; forming a refractory metal film over an area extending from said impurity diffusion layer to the field area; and heat treating to form a refractory metal silicide on the surface of said impurity diffusion layer, wherein said first impurities are present in the field oxide film in an amount sufficient to suppress a reaction between said refractory metal layer and said impurity-containing field oxide film in the heat treating step. The above-noted masking layer preferably is a silicon nitride film used as a mask when forming the field oxide film. In this case, preferably, the thickness of the silicon nitride film is greater than the mean projection range of implanted arsenic ions introduced as frist impurities into the field oxide film.

In accordance with a second embodiment, the masking layer may comprise a silicon nitride film for defining the above-noted field area and an insulation layer providing the material of the field oxide film. After ion implantation, the surface of the substrate is planarized using chemical and mechanical polishing to remove the silicon nitride film and a portion of the insulation film. In this case, preferably, the insulation layer is a CVD silicon oxide film having a thickness of 100 nm or more; preferably 150 nm or thicker. Furthermore, preferably, the above-noted impurity diffusion layer is a P-type diffusion layer providing the source and drain of a P-channel insulation gate field effect transistor. Further still, preferably, the above-noted refractory metal film is a titanium film.

BRIEF DESCRIPTION OF THE DRAWINGS

FIGS. 5(A)–5(C) show cross sections sequentially illustrating processes of the semiconductor device manufacturing method in accordance with a second embodiment of the present invention;

FIG. 7 is a graph illustrating the relationship between the arsenic implanting energy and the non-defective ratio due to leakage current between diffusion layers;

|  | Wet Etching Time | Second Heat Treatment |
| --- | --- | --- |
| — ▲ — | 30 Seconds | No |
| — ■ — | 30 Seconds | Yes |
| — ● — | 8 Seconds | No |
| — △ — | 30 Seconds | No |
| — □ — | 30 Seconds | Yes |
| — ○ — | 8 Seconds | No |

DETAILED DESCRIPTION OF THE PREFERRED EMBODIMENTS

This invention is described in further detail by way of example with reference to the accompanying drawings.

FIGS. 1(A)–1(C) through 4(A)–4(C) sequentially show a method of manufacturing a semiconductor device in accordance with a first embodiment of the present invention. The first embodiment includes the step of forming a silicon oxide film in the field areas by thermal oxidation.

Figure 1A:
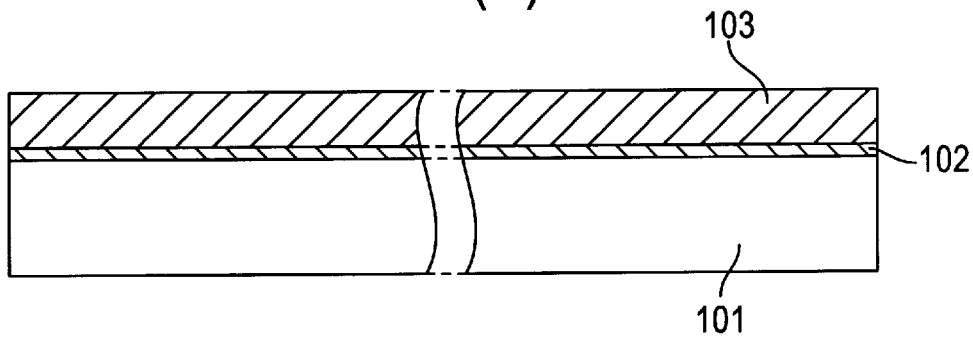
FIGS. 1(A)–1(C) show cross sections sequentially illustrating processes of the semiconductor device manufacturing method in accordance with a first embodiment of the present invention.

First, as shown in FIG. 1(A), a silicon oxide film 102 is formed on a silicon substrate 101, and then, a silicon nitride film 103 is formed thereon in a thickness, for example, of about 200 nm. Here, the thickness of the silicon nitride film 103 presents an important parameter for the process. This is because in the present invention, impurities are implanted over the whole surface of the wafer after forming the field oxide film. Thus, if the impurities intended to suppress the silicide reaction enter the transistor active area, the sub-threshold characteristic of the transistor changes. Namely, the thickness of the silicon nitride film must be higher than the mean projection range of the arsenic impurity that is subsequently implanted into the field area.

Figure 1B:
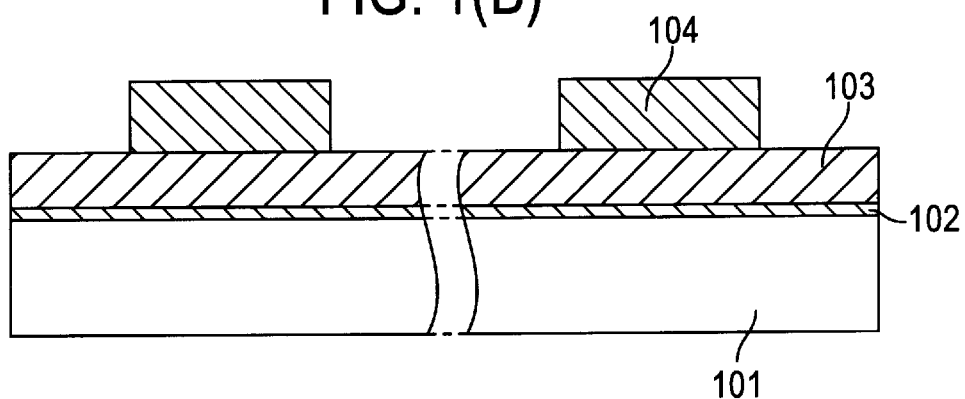

Next, as shown in FIG. 1(B), a resist 104 is patterned by a general lithographic technique to expose the element isolation area.

Figure 1C:
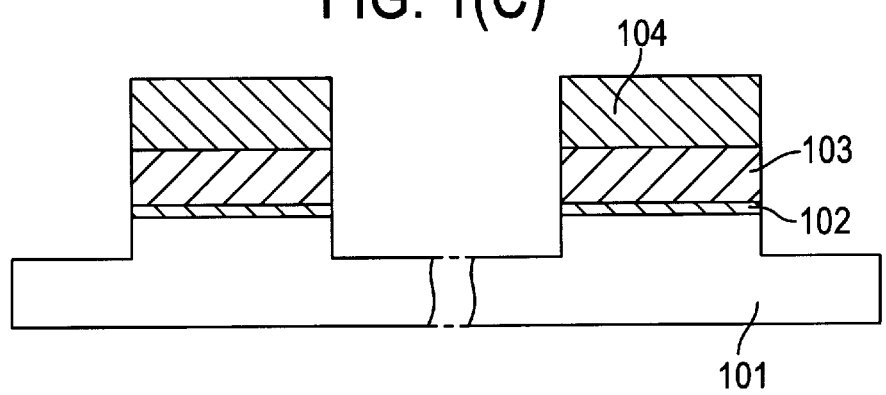

As shown in FIG. 1(C), the silicon nitride film 102, the silicon oxide film 102 and the silicon substrate 101 are etched by a dry etching technique. The remaining portion of the silicon substrate 101 under the silicon nitride film 103 provides the transistor active area, and the portion of the silicon substrate 101 etched to form an indentation provides the field area.

Figure 2A:
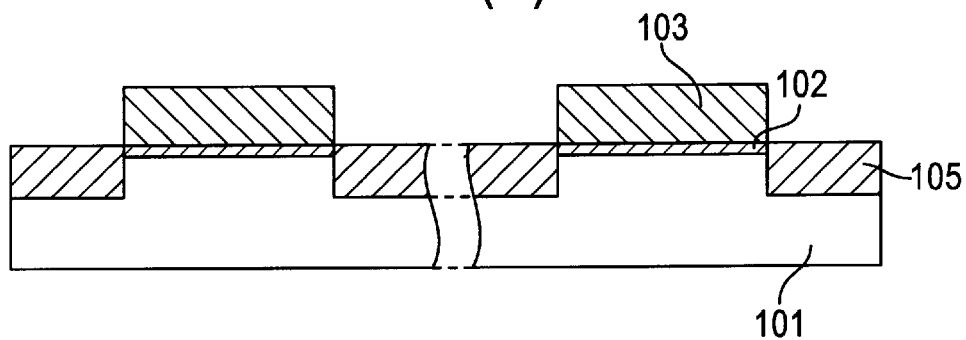
FIGS. 2(A)–2(C) show cross sections sequentially illustrating processes continued from FIGS. 1(A)–1(B)

Then, as shown in FIG. 2(A), after removing the resist, the silicon substrate 101 is heat-treated in an $H_2O_2$ atmosphere to oxidize the same and form a field silicon oxide film 105.

Figure 2B:
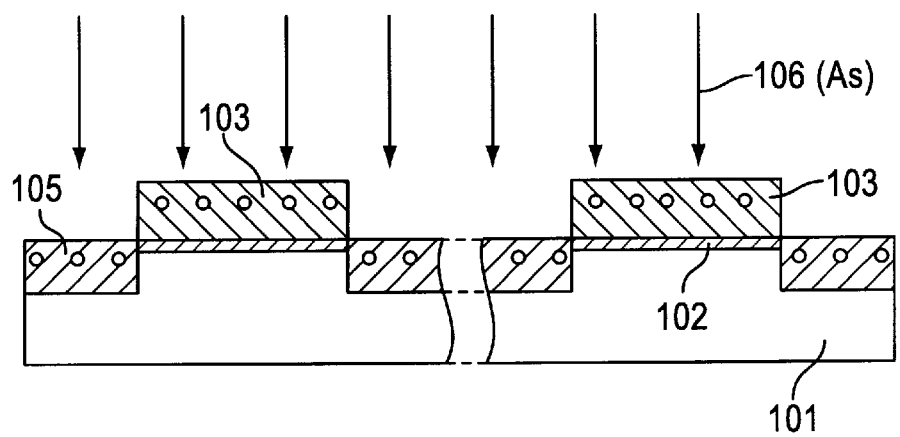

As shown in FIG. 2(B), arsenic ion (the first arsenic ion implantation) 106 is implanted over the whole surface of the wafer at an energy, for example, of 10 kev and in a dose, for example, of about $3 \times 10^{15}$ cm$^{-2}$. The arsenic ions are denoted by the black dots in FIGS. 2(B) through 4(C).

FIG. 7 shows the non-defective ratio due to leakage current between the diffusion layers of different MOS transistors as a function of the arsenic implanting energy. It is clear from FIG. 7 that an energy below 60 keV can effectively suppress the leakage current. Namely, ion-implanting arsenic at a low energy of less than 60 kev can effectively suppress the silicide reaction on the field silicon oxide film.

In the subsequent processes, the gate electrode and the diffusion layer can be formed in a conventional manner followed by forming a silicide film to thereby provide the desired CMOS device. Also, after removing the silicon nitride film 103 and the silicon oxide film 102, depending on the substrate type, a well region (not shown) having a conductivity type opposite that of the substrate is formed either in the N-channel transistor regions or in the P-channel transistor regions in a manner well know to those of ordinary skill in the art.

Figure 2C:
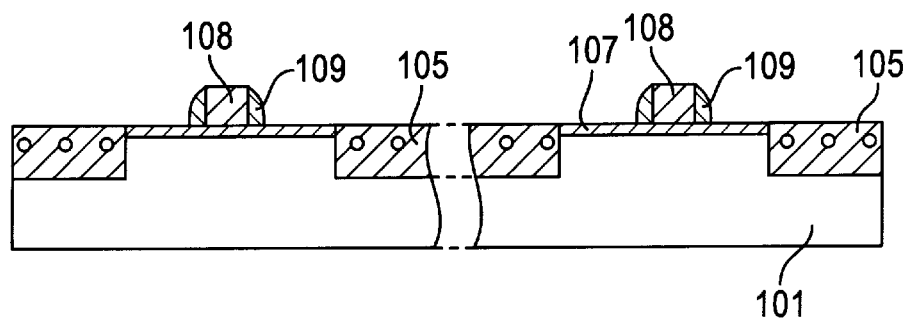

Namely, as shown in FIG. 2(C), the silicon nitride film 103 and the silicon oxide film 102 are removed by wet etching, a gate oxide film 107 is formed by thermal oxidation, a polysilicon film is formed, and the polysilicon is patterned to form a polysilicon gate electrode 108. Then, after forming a silicon nitride film, the silicon nitride film is anisotropically etched to form a sidewall spacer 109.

Figure 3A:
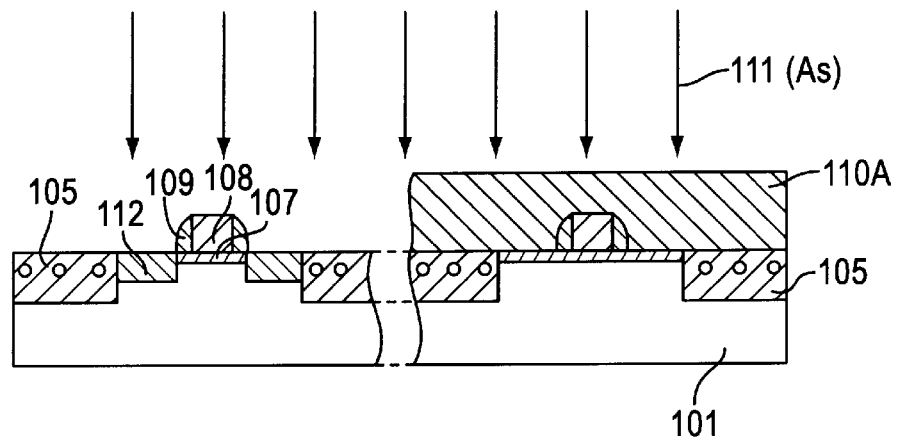
FIGS. 3(A)–3(C) show cross sections sequentially illustrating processes continued from FIGS. 2(A)–2(C)

Next, as shown in FIG. 3(A), the area in which the P-channel transistor is to be formed is covered with a resist pattern 110A and arsenic ion (the second arsenic ion implantation) is implanted. Afterwards, the silicon substrate is heat treated to active and form N$^+$ diffusion layers 112 that provide the respective source and drain of the N-channel transistor.

Figure 3B:
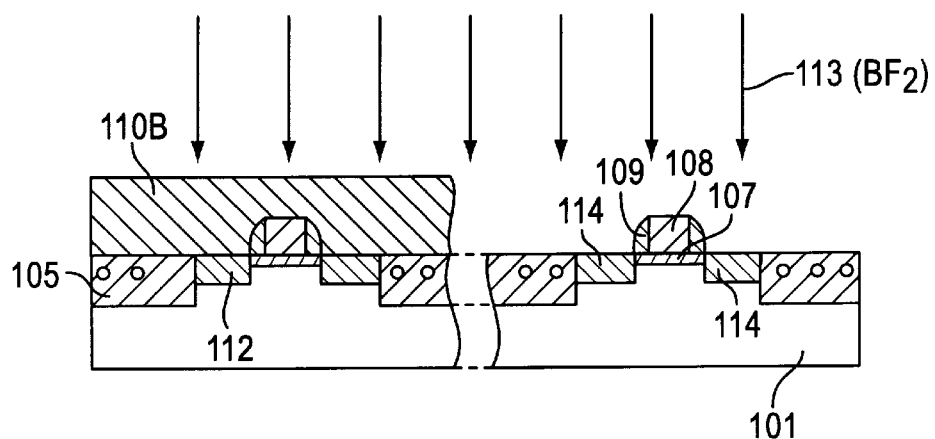

Then, as shown in FIG. 3(B), after removing the resist pattern 110A, the area in which the N-channel transistor is to be formed is covered with a resist pattern 110B, and impurities 113 such as boron are implanted. After removing the resist 110, a P$^+$ diffusion layer 114 is formed on the silicon substrate by heat treating at a temperature of from 800 to 1000 degrees centigrade. The diffusion layers 114 provide the source and drain of the P-channel transistor.

Figure 3C:
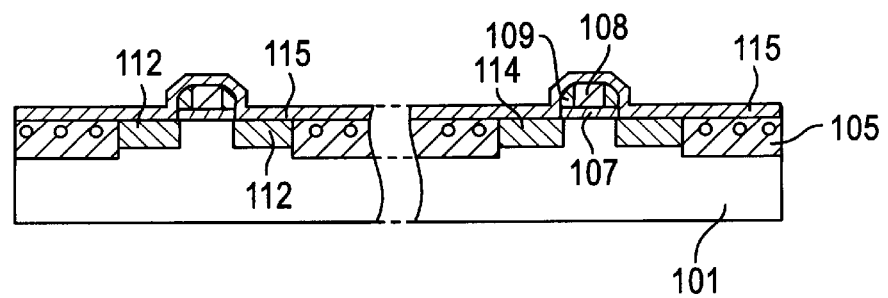

Then, as shown in FIG. 3(C), a titanium film 115 is grown to a thickness of about 50 nm by metal sputtering or the like.

Figure 4A:
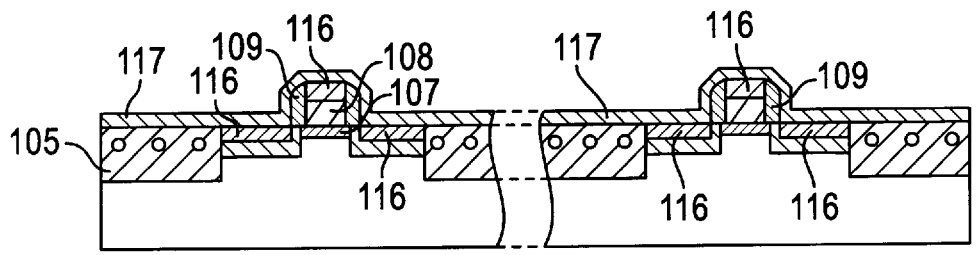
FIGS. 4(A)–4(C) show cross sections sequentially illustrating processes continued from FIGS. 3(A)–3(C)

As shown in FIG. 4(A), heat treatment (the first heat treatment) is performed using a lamp annealing apparatus in a nitrogen atmosphere at atmospheric pressure for 30 to 60 seconds. The treatment temperature is set to from 600 to 650 degrees centigrade.

Thus, a titanium silicide is formed. Namely, a C49 silicide layer structure 116 having a crystalline structure having a high electrical specific resistance of about 60 $\mu\Omega$·cm and a titanium nitride 117 are formed on the exposed surface of the gate electrode polysilicon 108 and the surfaces of the N$^+$ diffusion layers 112 and the P$^+$ diffusion layers 114 as shown in FIG. 4(A).

Although titanium is used in this embodiment as the refractory metal, I expect that tungsten, tantalum, molybdenum, zirconium and hafnium are also useful in forming the refractory metal silicide.

In the area implanted with boron, the arsenic contained in the silicon oxide film prevents the silicide reaction. Therefore, a short circuit pass spanning the diffusion layers is not formed.

Figure 4B:
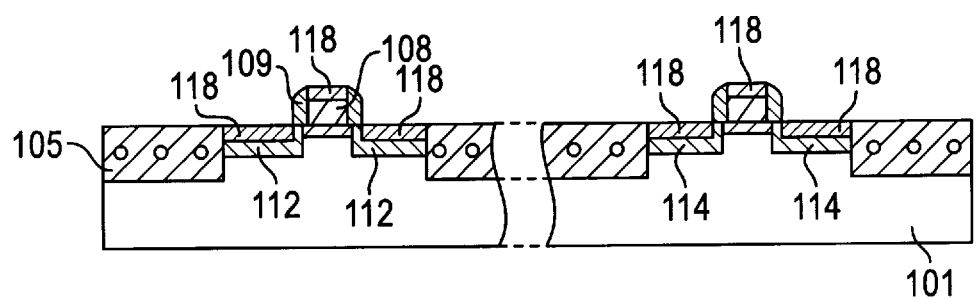

Next, as shown in FIG. 4(B), the titanium nitride layer 117 is removed by a liquid chemical obtained by mixing ammoniacal solution, pure water and hydrogen peroxide water. Furthermore, the second heat treatment is performed in a nitrogen atmosphere at atmospheric pressure for about 60 seconds. The heat treatment apparatus can be the lamp annealing apparatus used in the first heat treatment, and the processing temperature is set to about 850 degrees centigrade.

In this heat treatment, the above-mentioned C49 silicide layer structure 116 changes to a C54 silicide layer structure 118 having a low electrical specific resistance of about 20 $\mu\Omega$·cm. Namely, a C54 silicide structure 118 is formed only on the gate electrode polysilicon 108 and the N$^+$ diffusion layers 112 and the P$^+$ diffusion layers 108 that provide the source and drain areas.

Figure 4C:
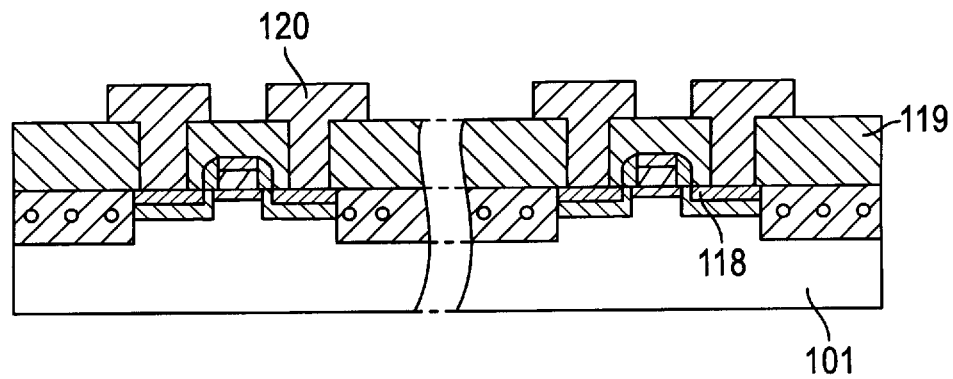

Next, an oxide film is grown to form an interlayer film 119. Lithographic processing and oxide film etching are carried out again to form an aluminum wiring 120, to thereby obtain the desired CMOS device as shown in FIG. 4(C).

The following describes a semiconductor device manufacturing method in accordance with a second embodiment of the present invention with reference to FIGS. 5(A)–5(C) and 6(A)–6(D). In the second embodiment, a field oxide film is formed using chemical and mechanical polishing.

First, as shown in FIG. 5(A), a silicon oxide film 202 is formed on a silicon substrate 201, and then a silicon nitride film 203 is formed thereon. The thickness of this silicon nitride film 203 can be reduced in order to facilitate patterning. This is because a thick CVD silicon oxide film 205 is formed over the element area in a subsequent step and is sufficient to prevent the arsenic impurity from penetrating into the element area, regardless of the arsenic implantation energy. Thus, unlike the case of the silicon nitride film 203 of the first embodiment, the mean projection range of the arsenic impurity is not a parameter. Also, a mask is not formed by a selective thermal oxidizing technique.

Next, as shown in FIG. 5(B), a resist 204 is patterned by a general lithographic technique to expose the element isolation area.

Then, as shown in FIG. 5(C), dry etching is carried out using the resist 204 as a mask to selectively etch the silicon nitride film 203, the silicon oxide film 202 and the silicon substrate 201. This forms an indentation in the silicon substrate at the position of the field area.

Figure 6A:
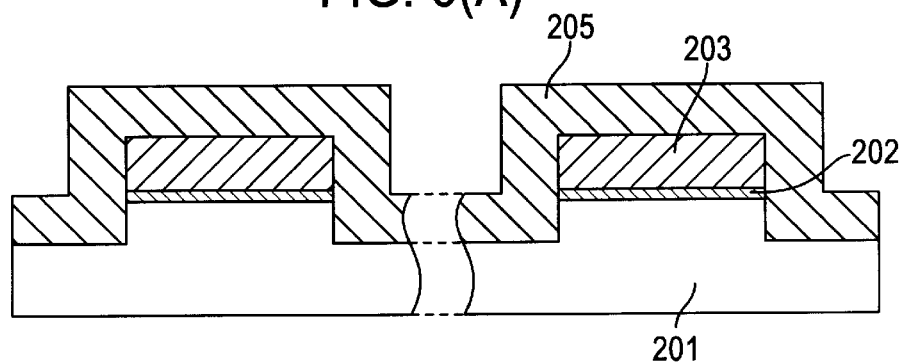
FIGS. 6(A)–6(D) show cross sections sequentially illustrating processes continued from FIGS. 5(A)–5(C)

Next, as shown in FIG. 6(A), after removing the resist, a silicon oxide film 205 is deposited by a general chemical vapor deposition technique to form the field oxide film 205.

Figure 6B:
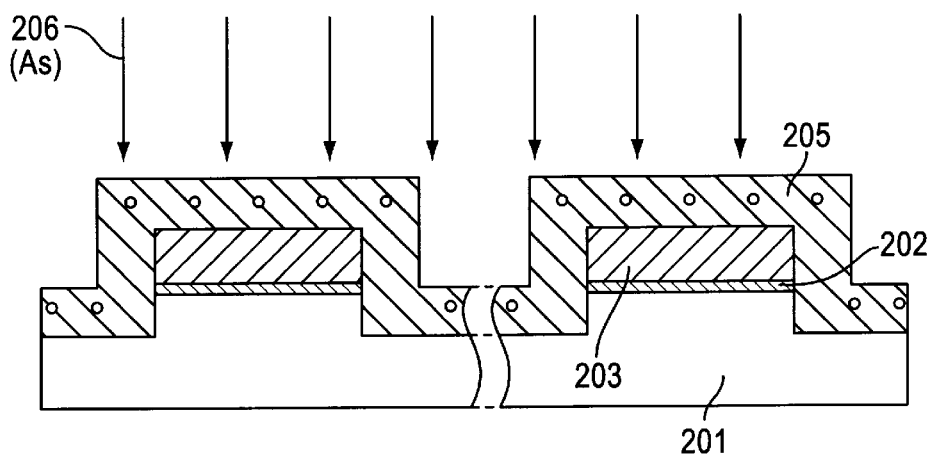

Next, as shown in FIG. 6(B), arsenic 206 is ion-implanted over the whole surface of the wafer.

This ion implantation 206 is carried out at an energy of 4 keV and at a dose of about $3\times10^{15}$ cm$^{-2}$ to suppress the short circuit path formation that is otherwise caused by the silicide reaction on the silicon oxide film in the silicide forming process.

Figure 6C:
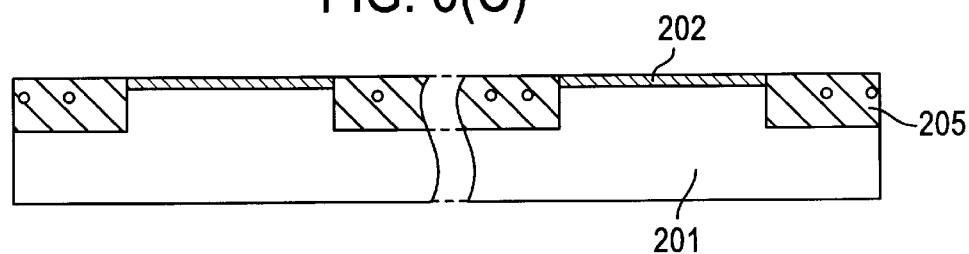
Figure 6D:
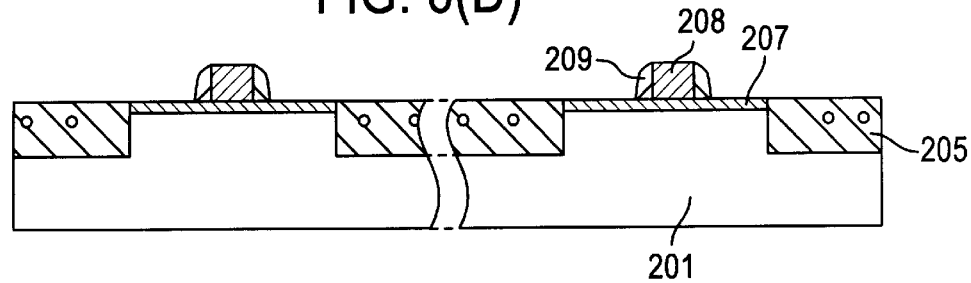

In this example, the transistor active area is masked with the silicon oxide film and the silicon nitride film such that it is difficult for arsenic to penetrate into the active area in the first ion-implantation 206. Thus, the transistor characteristics are not adversely affected. In FIGS. 6(B) through 6(D), the implanted arsenic ions are denoted by black dots.

Figure 8:
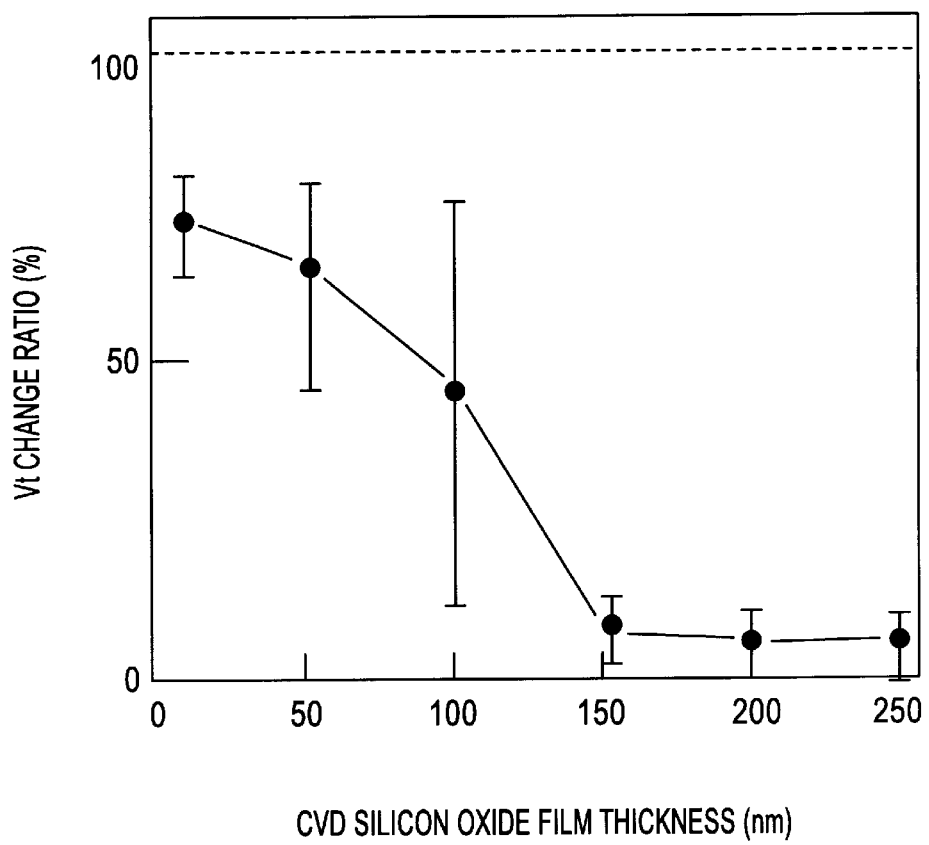
FIG. 8 is a graph illustrating the relationship between the CVD silicon oxide film thickness and the Vt change ratio (%)
Figure 9A:
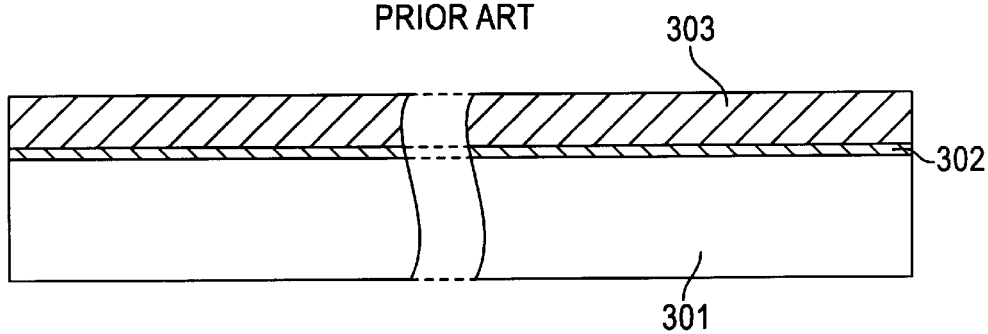
FIGS. 9(A)–9(C) show cross sections sequentially illustrating processes of a prior-art semiconductor device manufacturing method.
Figure 9B:
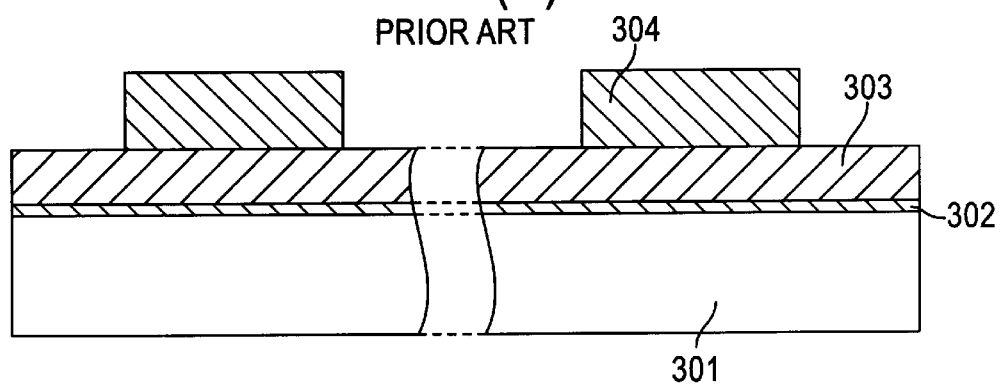
Figure 9C:
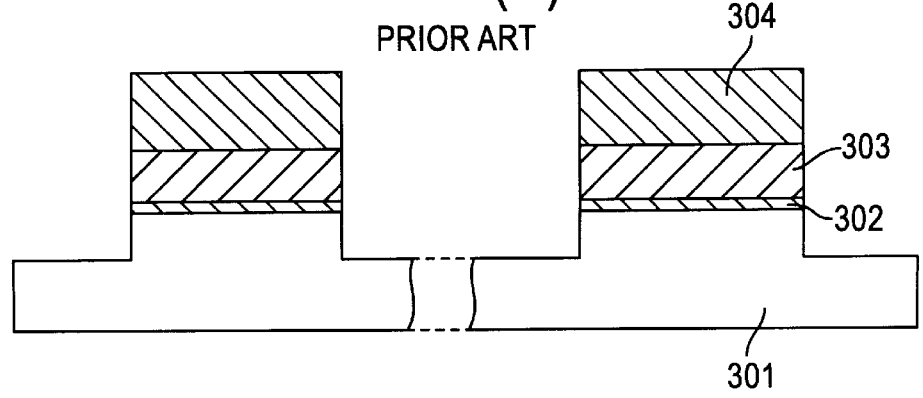
Figure 10A:
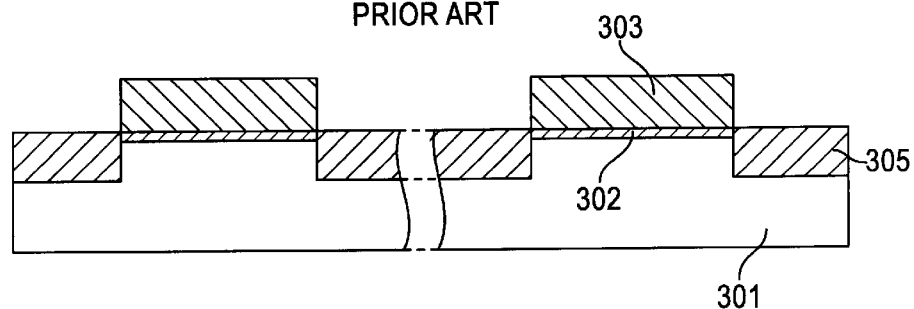
FIGS. 10(A)–10(C) show cross sections sequentially illustrating processes continued from FIGS. 9(A)–9(C)
Figure 10B:
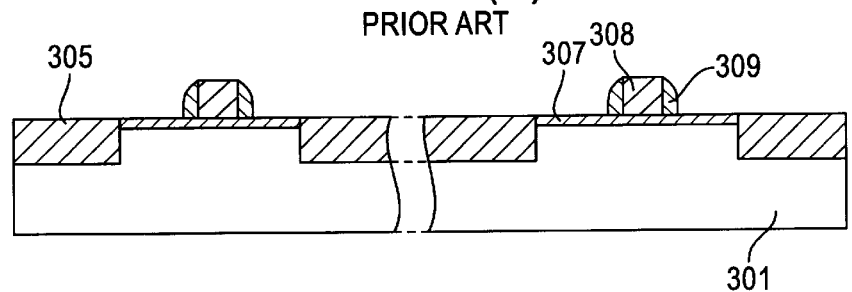
Figure 10C:
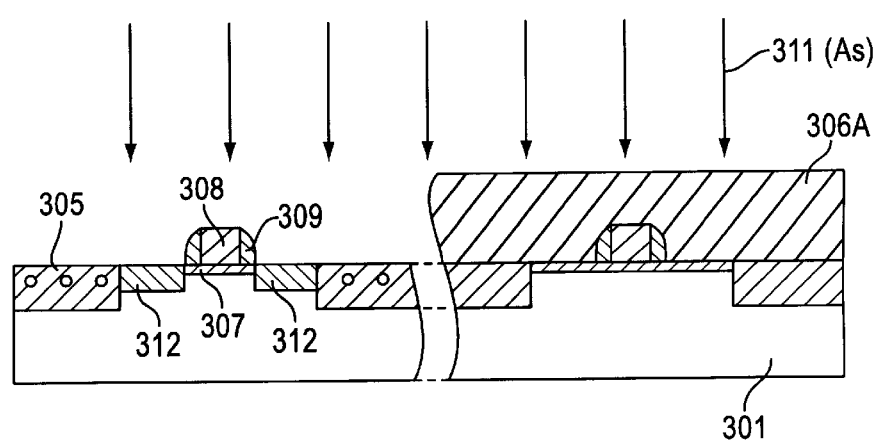
Figure 11A:
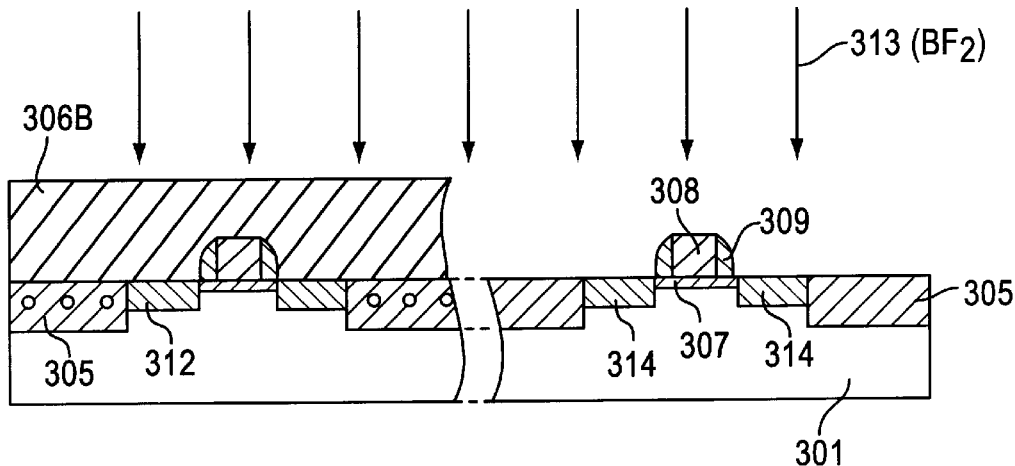
FIGS. 11(A)–11(C) show cross sections sequentially illustrating processes continued from FIGS. 10(A)–10(C)
Figure 11B:
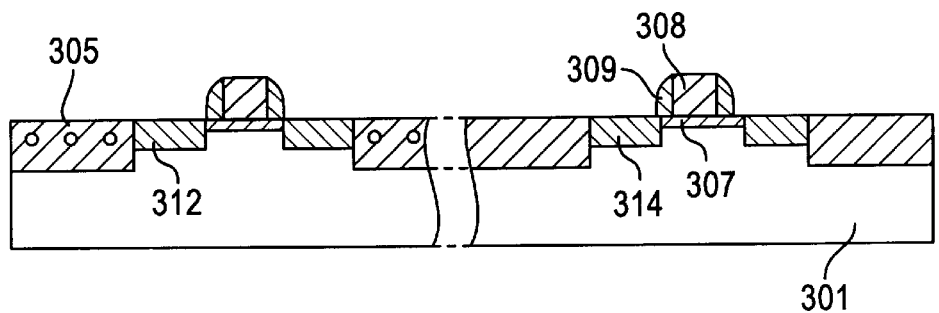
Figure 11C:
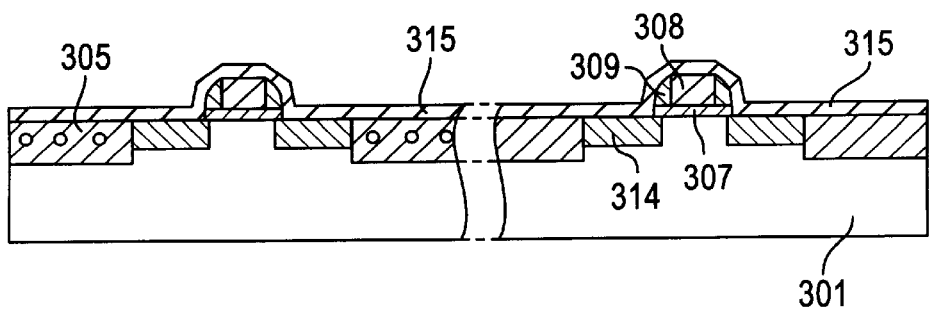
Figure 12A:
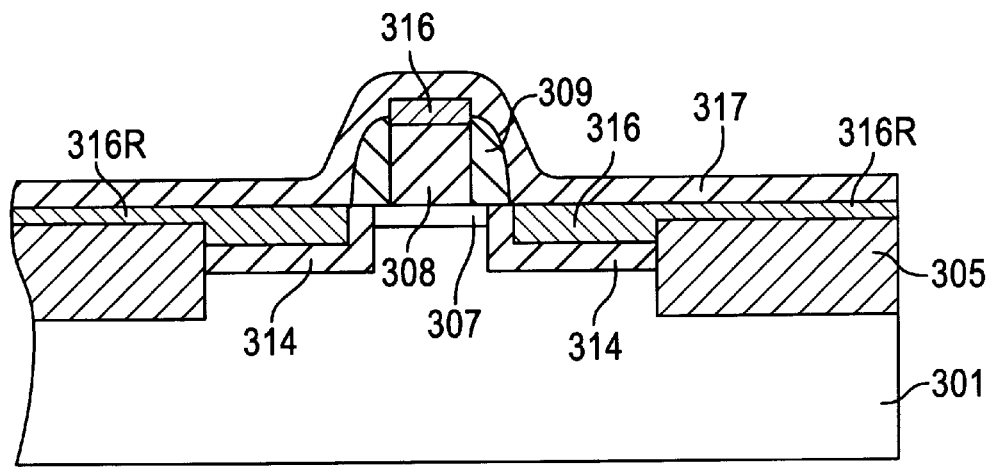
FIGS. 12(A)–12(B) shows enlarged cross sections sequentially illustrating processes continued from FIG. 11 with respect to a P-channel MOS transistor.
Figure 12B:
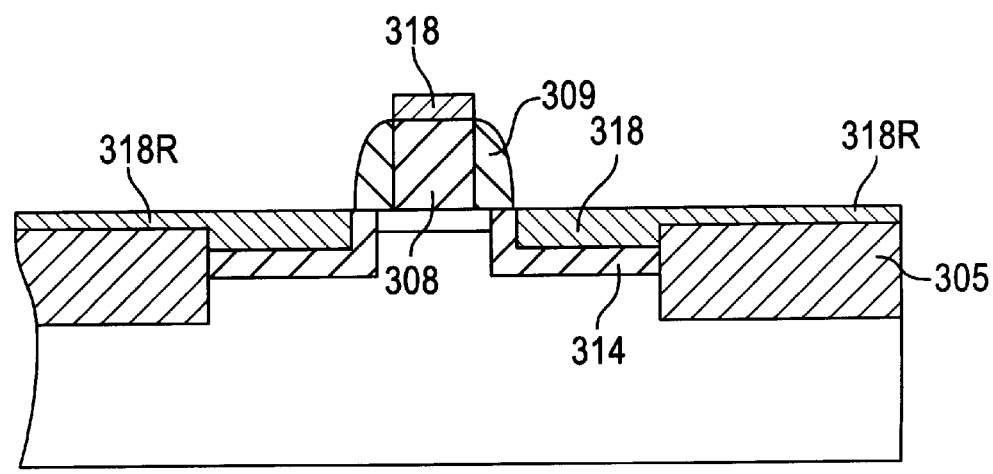
Figure 13:
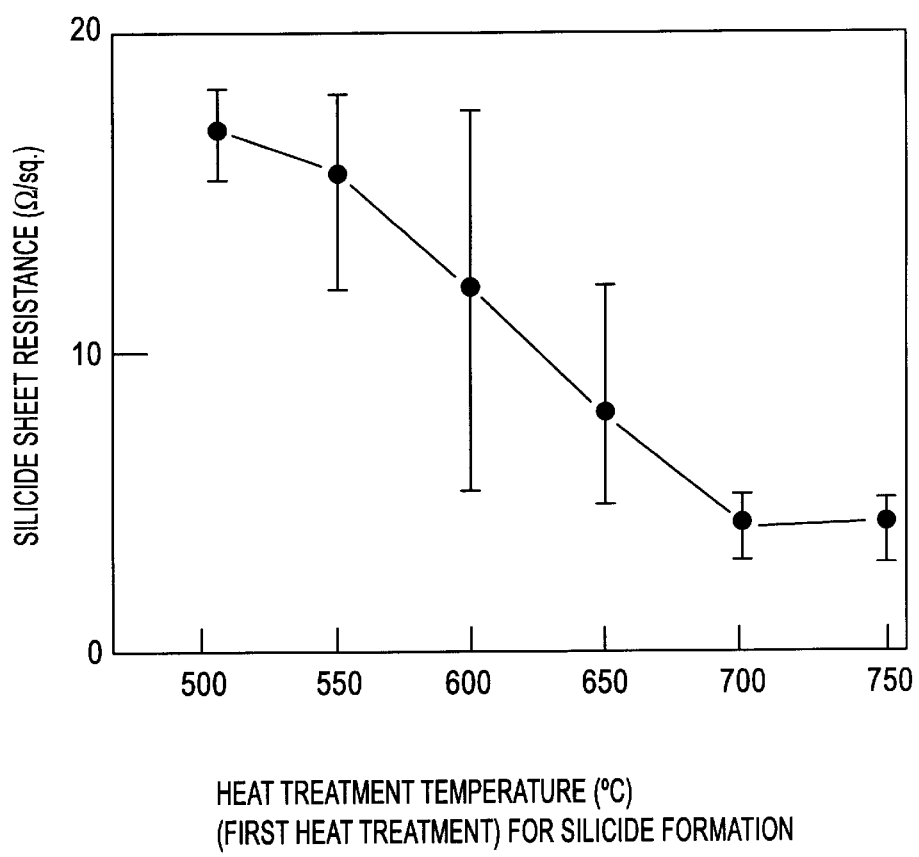
FIG. 13 is a graph illustrating the relationship between the silicide forming temperature and the silicide sheet resistance.
Figure 14:
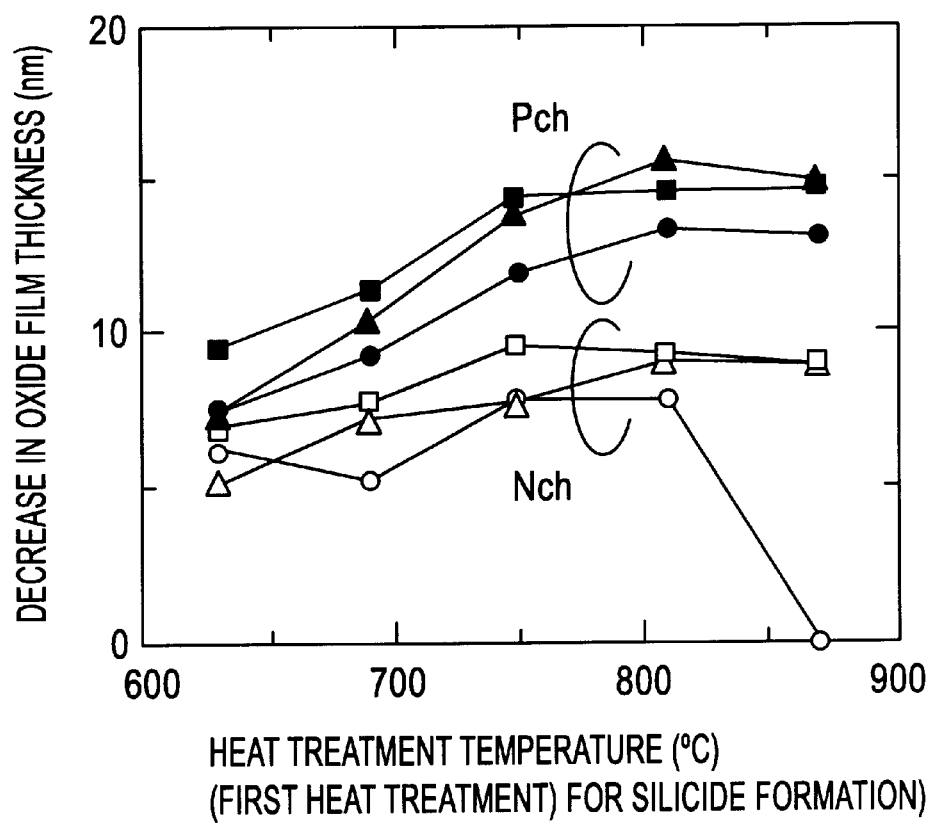
FIG. 14 is a graph illustrating the relationship between the silicide forming temperature and the reduction in oxide film thickness. The parameters of FIG. 14 are as follows.

FIG. 8 shows the relationship of the CVD silicon oxide film thickness to the sub-threshold voltage (Vt) of an N-channel MOS transistor, by way of example.

As shown in FIG. 8, by growing a silicon oxide film to a thickness of 100 nm or more or, preferably, 150 nm or more, a 5 first arsenic ion implantation can be achieved which does not affect the transistor characteristics. Therefore, the silicide reaction on the silicon oxide film can be suppressed without adversely affecting the transistor area.

Next, as shown in FIG. 6(C), the silicon nitride film 203 over the silicon oxide film 202 and the silicon oxide film 205 formed by chemical vapor deposition over the silicon oxide film 202 are removed by chemical and mechanical polishing to form a buried field silicon oxide film 205 in the silicon substrate field area.

Next, as shown in FIG. 6(D), the silicon oxide film 202 is removed by wet etching, a gate oxide film 207 is formed by thermal oxidation, a polysilicon film is formed, and the polysilicon film is patterned to form a polysilicon gate electrode 208. Then, after forming a silicon nitride film, the silicon nitride film is anisotropically etched to form a sidewall spacer 209.

Then, a desired CMOS semiconductor device can be manufactured by following the same processes as shown in FIGS. 3(A) through 4(C) of the first embodiment.

In the second embodiment, the transistor active area is masked with the silicon oxide film and the silicon nitride film such that the first arsenic implantation does not penetrate into the active area and the transistor characteristics are not adversely affected.

As mentioned above and in accordance with the invention, arsenic is also implanted into the $P_{ch}$ area of the field oxide film in the field oxide film forming process. The reduction reaction between the titanium film and the field silicon oxide film in the titanium silicide forming process is suppressed, which in turn suppresses the leakage current between the diffusion layers of different MOS transistors.

It should further be apparent to those skilled in the art that various changes in form and detail of the invention as shown and described above may be made. It is intended that such changes be included within the spirit and scope of the claims appended hereto.

What is claimed is:

1. A method of manufacturing a semiconductor device comprising the steps of:
    masking element areas of a silicon substrate of a first conductivity type with a masking layer;
    forming a field oxide film on field areas of the silicon substrate which are not protected by said masking layer to define separate element areas;
    introducing first impurities of said first conductivity type into said field oxide film;
    removing said masking layer and introducing second impurities of a second conductivity type opposite said first conductivity type into said field oxide film and into said element area to form an impurity diffusion layer;
    forming a refractory metal film over an area extending from said impurity diffusion layer to the field area; and
    heat treating to form a refractory metal silicide on the surface of said impurity diffusion layer;
    wherein said first impurities are present in the field oxide film in an amount sufficient to suppress a reaction between said refractory metal layer and said impurity-containing field oxide film in the heat treating step.

2. The method of manufacturing a semiconductor device as claimed in claim 1, wherein said first impurities comprise arsenic and said second impurities comprise boron.

3. The method of manufacturing a semiconductor device as claimed in claim 1, wherein said masking layer comprises a silicon nitride film.

4. The method of manufacturing a semiconductor device as claimed in claim 3, wherein said step of introducing impurities of said first conductivity type comprises ion-implanting said impurities, and said silicon nitride film has a thickness that is greater than the mean projection range of said implanted impurities.

5. The method of manufacturing a semiconductor device as claimed in claim 1, wherein said impurity diffusion layer comprises at least two P-type diffusion layers which form the respective source and drain of a P-channel field effect transistor.

6. The method of manufacturing a semiconductor device as claimed in claim 1, wherein said refractory metal film comprises titanium.

7. A method of manufacturing a semiconductor device, comprising the steps of:
    masking element areas of a silicon substrate of a first conductivity type with a masking layer;

forming a field oxide film on field areas of the silicon substrate which are not protected by said masking layer to define separate element areas;

introducing first impurities of said first conductivity type into said field oxide film;

removing said masking layer;

forming a gate oxide film on said element areas and a polysilicon gate on a portion of said gate oxide film;

removing the gate oxide that is not covered by said polysilicon gate;

introducing second impurities of a second conductivity type opposite said first conductivity type into said field oxide film and into said element areas using the polysilicon gate as a mask to form source and drain regions;

forming a refractory metal film on said polysilicon gate and over an area extending from the source and drain regions to the field area; and heat treating to form a refractory metal silicide on the surface of the source and drain regions and on said polysilicon gate;

wherein said first impurities are present in the field oxide film in an amount sufficient to suppress a reaction between said refractory metal layer and said impurity-containing field oxide film in the heat treating step.

8. The method of manufacturing a semiconductor device as claimed in claim 7, wherein said first impurities comprise arsenic and said second impurities comprise boron.

9. The method of manufacturing a semiconductor device as claimed in claim 7, further comprising the steps of removing the refractory metal from the surface of the field oxide film; forming an interlayer on the whole surface of said substrate; providing contact holes in said interlayer film to expose said source and drain regions; depositing a metal film on said substrate and into said contact holes; and patterning the metal film to form a metallic wiring.

10. A method of manufacturing a semiconductor device, comprising the steps of:

forming a patterned masking layer on a silicon substrate of a first conductivity type to define field areas and element areas which are masked by said masking layer;

depositing a silicon oxide film on the whole surface of said substrate;

introducing first impurities of said first conductivity type into the whole surface of the substrate in such manner that said impurities do not penetrate the element areas;

removing said masking layer and a portion of said silicon oxide film to leave a silicon field oxide film on the field areas and to define separate element areas;

forming a gate oxide film on said element areas and a polysilicon gate on a portion of said gate oxide film;

removing the gate oxide that is not covered by said polysilicon gate;

introducing second impurities of a second conductivity type opposite said first conductivity type into said field oxide film and into said element areas using the polysilicon gate as a mask to form source and drain regions;

forming a refractory metal film over an area extending from the source and drain regions to the field area; and heat treating to form a refractory metal silicide on the surface of the source and drain regions and on said polysilicon gate;

wherein said first impurities are present in the field oxide film in an amount sufficient to suppress a reaction between said refractory metal layer and said impurity-containing field oxide film in the heat treating step.

11. The method of manufacturing a semiconductor device as claimed in claim 10, wherein said step of removing said masking layer and a portion of said silicon oxide film comprises chemical and mechanical polishing.

12. The method of manufacturing a semiconductor device as claimed in claim 10, wherein said step of depositing a silicon oxide film on the whole surface of said substrate comprises depositing a CVD silicon oxide film.

13. The method of manufacturing a semiconductor device as claimed in claim 10, wherein said first impurities comprise arsenic and said second impurities comprise boron.

14. The method of manufacturing a semiconductor device as claimed in claim 10, further comprising the steps of removing the refractory metal from the surface of the field oxide film; forming an interlayer on the whole surface of said substrate; providing contact holes in said interlayer film to expose said source and drain regions; depositing a metal film on said substrate and into said contact holes; and patterning the metal film to form a metallic wiring.

15. The method of manufacturing a semiconductor device as claimed in claim 14, wherein said step of removing said masking layer and a portion of said silicon oxide film comprises chemical and mechanical polishing.

16. A method of manufacturing a semiconductor device comprising:

selectively forming a field insulating film on a semiconductor substrate of a first conductivity type having a field area and an element area, said field insulating film being formed in said field area to define said element area;

selectively introducing first impurities of said first conductivity type into said field insulating film while preventing said first impurities of said first conductivity type from being introduced into said element area; and introducing second impurities of a second conductivity type opposite said first conductivity type into at least one portion of said element area and into said field insulating film containing said first impurities.

17. The method of manufacturing a semiconductor device as claimed in claim 16, wherein said first conductivity type is an N type and said second conductivity type is a P type.

18. The method of manufacturing a semiconductor device as claimed in claim 16, wherein said first impurities comprise arsenic and said second impurities comprise boron.

19. The method of manufacturing a semiconductor device as claimed in claim 16, further comprising the steps of forming a metal layer in contact with said element area and said impurity-containing field insulating film, and heat treating to react said metal layer with said element area, wherein said first impurities are present in the field insulating film in an amount sufficient to suppress a reaction between said metal layer and said impurity-containing field insulating film in the heat treating step.

20. The method of manufacturing a semiconductor device as claimed in claim 19, wherein said first impurities comprise arsenic and said second impurities comprise boron.

21. The method as claimed in claim 16, which comprises forming said field insulating film using a mask and selectively introducing said first impurities of said first conductivity type using the same mask as used for forming the field insulating film.

22. The method as claimed in claim 16, wherein said semiconductor substrate has a first portion and a second portion, each of said first and second portions having said field area and said element area, said method comprising introducing said first impurities of said first conductivity type into the field area of each of said first and second portions using a first mask which covers said element area of each of said first and second portions, introducing said second impurities of said second conductivity type into the field area and the element area of said first portion using a second mask which covers said element area and said field area of said second portion, and introducing third impurities of said first conductivity type into the field area and the element area of said second portion using a third mask which covers said element area and said field area of said first portion before introducing said second impurities.

* * * * *

UNITED STATES PATENT AND TRADEMARK OFFICE
CERTIFICATE OF CORRECTION

PATENT NO. : 6,048,760
DATED : April 11, 2000
INVENTOR(S) : Yoshihisa MATSUBARA

It is certified that error appears in the above-identified patent and that said Letters Patent is hereby corrected as shown below:

Column 5, line 50 delete "kev" insert --keV--
         line 59 delete "kev" insert --keV--
Column 6, line 2 delete "know" insert --known--

Signed and Sealed this

First Day of May, 2001

Attest:

NICHOLAS P. GODICI

Attesting Officer    Acting Director of the United States Patent and Trademark Office

UNITED STATES PATENT AND TRADEMARK OFFICE
CERTIFICATE OF CORRECTION

PATENT NO. : 6,048,760
DATED : April 11, 2000
INVENTOR(S) : Yoshihisa Matsubara

It is certified that error appears in the above-identified patent and that said Letters Patent is hereby corrected as shown below:

<u>Column 5,</u>
Lines 50 and 59, delete "kev" insert -- keV --

<u>Column 6,</u>
Line 2, delete "know" insert -- known --

Signed and Sealed this

Fifth Day of October, 2004

JON W. DUDAS
*Director of the United States Patent and Trademark Office*